(12) United States Patent
Lindsey et al.

(10) Patent No.: US 6,555,999 B1
(45) Date of Patent: Apr. 29, 2003

(54) INSULATOR SUPPORT CURRENT SENSOR

(75) Inventors: Keith E. Lindsey, La Canada, CA (US); Richard J. Serocki, Costa Mesa, CA (US)

(73) Assignee: Lindsey Manufacturing Company, Azusa, CA (US)

(*) Notice: Subject to any disclaimer, the term of this patent is extended or adjusted under 35 U.S.C. 154(b) by 0 days.

(21) Appl. No.: 09/542,752

(22) Filed: Apr. 4, 2000

Related U.S. Application Data

(60) Provisional application No. 60/127,487, filed on Apr. 2, 1999.

(51) Int. Cl.[7] ................................................. G01R 1/20
(52) U.S. Cl. ................................ 324/76.11; 324/117 R; 324/96; 324/127
(58) Field of Search ........................ 324/117 H, 117 R, 324/127, 96, 76.11

(56) References Cited

U.S. PATENT DOCUMENTS

| | | | | |
|---|---|---|---|---|
| 2,585,707 A | | 2/1952 | Warner ........................ 324/119 |
| 3,418,575 A | * | 12/1968 | Spindle ..................... 324/117 R |
| 4,539,520 A | | 9/1985 | McBride ................... 324/117 H |
| 4,616,176 A | | 10/1986 | Mercure et al. ............. 324/127 |
| 4,630,218 A | | 12/1986 | Hurley ......................... 702/64 |
| 4,675,773 A | | 6/1987 | Shirakawa et al. ........... 361/63 |
| 4,724,381 A | * | 2/1988 | Crimmins .................... 324/127 |
| 5,124,642 A | | 6/1992 | Marx .......................... 324/127 |
| 5,181,026 A | | 1/1993 | Granville ................. 340/870.28 |
| 5,250,894 A | * | 10/1993 | Bridgese et al. ............. 324/127 |
| 5,252,913 A | * | 10/1993 | Falkowski et al. ........... 324/127 |
| 5,426,360 A | * | 6/1995 | Maraio et al. ............... 324/126 |
| 5,585,611 A | * | 12/1996 | Harvey et al. ............... 218/134 |

FOREIGN PATENT DOCUMENTS

| | | |
|---|---|---|
| DE | 196 13 664 A1 | 10/1997 |
| EP | 0 002 387 A1 | 6/1979 |
| EP | 0 360 592 A1 | 3/1990 |
| EP | 0 838 686 A2 | 4/1998 |
| JP | 61-214308 A | 9/1986 |
| JP | 61-214309 A | 9/1986 |
| JP | 2059678 | 2/1990 |
| JP | 2139811 | 5/1990 |
| JP | 11008041 | 1/1999 |
| JP | 11297145 | 10/1999 |
| SU | 1571690 A1 | 6/1990 |
| WO | WO 94/25973 | 11/1994 |
| WO | WO 99/42844 | 8/1999 |

* cited by examiner

*Primary Examiner*—N. Le
*Assistant Examiner*—Vincent Q. Nguyen
(74) *Attorney, Agent, or Firm*—Christie, Parker & Hale, LLP

(57) ABSTRACT

A system and method for measuring at least one characteristic of a power line supported by a power line pole includes a pin having a first end coupled to the pole and a second end adapted to engage a sensor, wherein the sensor measures at least one characteristic of the power line and an insulator coupled to the second end of the pin supports the power line. The close proximity of the sensing element to the conductor immerses the sensor in the strong magnetic field close to the current carrying conductor to provide low cost accurate current measurement capability.

32 Claims, 8 Drawing Sheets

INSULATOR SUPPORT CURRENT SENSOR

CROSS-REFERENCE TO RELATED APPLICATION(S)

This application claims the benefit of U.S. Provisional Patent Application No. 60/127,487 Provisional application expired, filed Apr. 2, 1999, the contents of which are hereby incorporated by reference.

FIELD OF THE INVENTION

The present invention relates generally to power distribution systems, and more particularly, to sensors and systems for estimating characteristics of a power line.

BACKGROUND

Electrical energy plays a central role in industrialized societies. The reliability of electric power systems is a critical factor in the planning, design and operation of power distribution systems. To ensure reliability, automated, real-time control of the system is desirable to allow for rapid respond to the actual demand of electricity and any unforeseen contingencies (equipment outages).

Modernized power distribution networks typically utilize energy control centers to monitor and regulate network operation. Although these centers have greatly advanced in technology, their basic control objectives of economy and security remain the same. The economic goal is to minimize the cost of supplying the electrical demand. The security goal is directed to the minimum requirements for reliability and quality of service. Electric utilities desire measurements of line voltage and current to allow for automated customer billing, load and reliability monitoring, and for real time control of the system.

Traditionally, current measurements with accuracies to within 0.3% or less are desired for customer billing while less accurate measurements (1 to 10%) typically suffice for other functions such as fault isolation and system control. However, in the past, many electric utilities typically employed highly accurate and very expensive current and or voltage transformers to perform measurements requiring strict accuracy as well as well as measurements to support functions such as fault isolation that require less accuracy. System inefficiencies are further exaggerated by the fact that distribution lines must be cut to accommodate the installation of conventional current transformers, which in most cases, is labor intensive.

Recently, the cost of measuring voltage and current in the 1 to 10% accuracy range in electrical power distribution feeders has decreased. Presently, line post current sensors that include a sensing element permanently embedded within an insulator are used as a less expensive and easier to install alternative to current transformers. Some other current sensors are connected at high voltage potential but the output signals must have isolation from the high voltage; frequently this is done via radio or fiber optic communications. There are also economical, temporary current sensors that are held in place with hot line sticks or are simply hung over the line. The installation time and effort of most new measuring devices is less than the time Be and effort to install current transformers. However, electric utility personnel are very familiar with the traditional current transformers and adoption of new devices within the industry has been gradual.

Therefore, it would be advantageous to provide a compact, lightweight sensing device that measures at least one operating characteristic of an overhead power line that may be readily attached and removed from a power line. The sensing device should preferably be suitable for economy of manufacture and durable to minimize operation and maintenance cost.

SUMMARY OF THE INVENTION

In one aspect of the present invention, a system for measuring at least one characteristic of a power line is supported by a power line pole and includes a pin having one end coupled to the pole and a second end adapted to engage a sensor. The sensor measures at least one characteristic of the power line. An insulator coupled to the second end of the pin, supports the power line in a conventional manner.

In another aspect of the present invention, a method for measuring at least one characteristic of a power line supported by a power line pole includes engaging a sensor with a first end of a pin, coupling an insulator to the first end of the pin, coupling a second end of the pin to the power pole, coupling the power line to the insulator, and measuring a characteristic of the power line.

DESCRIPTION OF THE DRAWINGS

These and other features, aspects, and advantages of the present invention will become better understood with regard to the following description, appended claims, and accompanying drawings where:

DETAILED DESCRIPTION OF THE INVENTION

Figure 1:
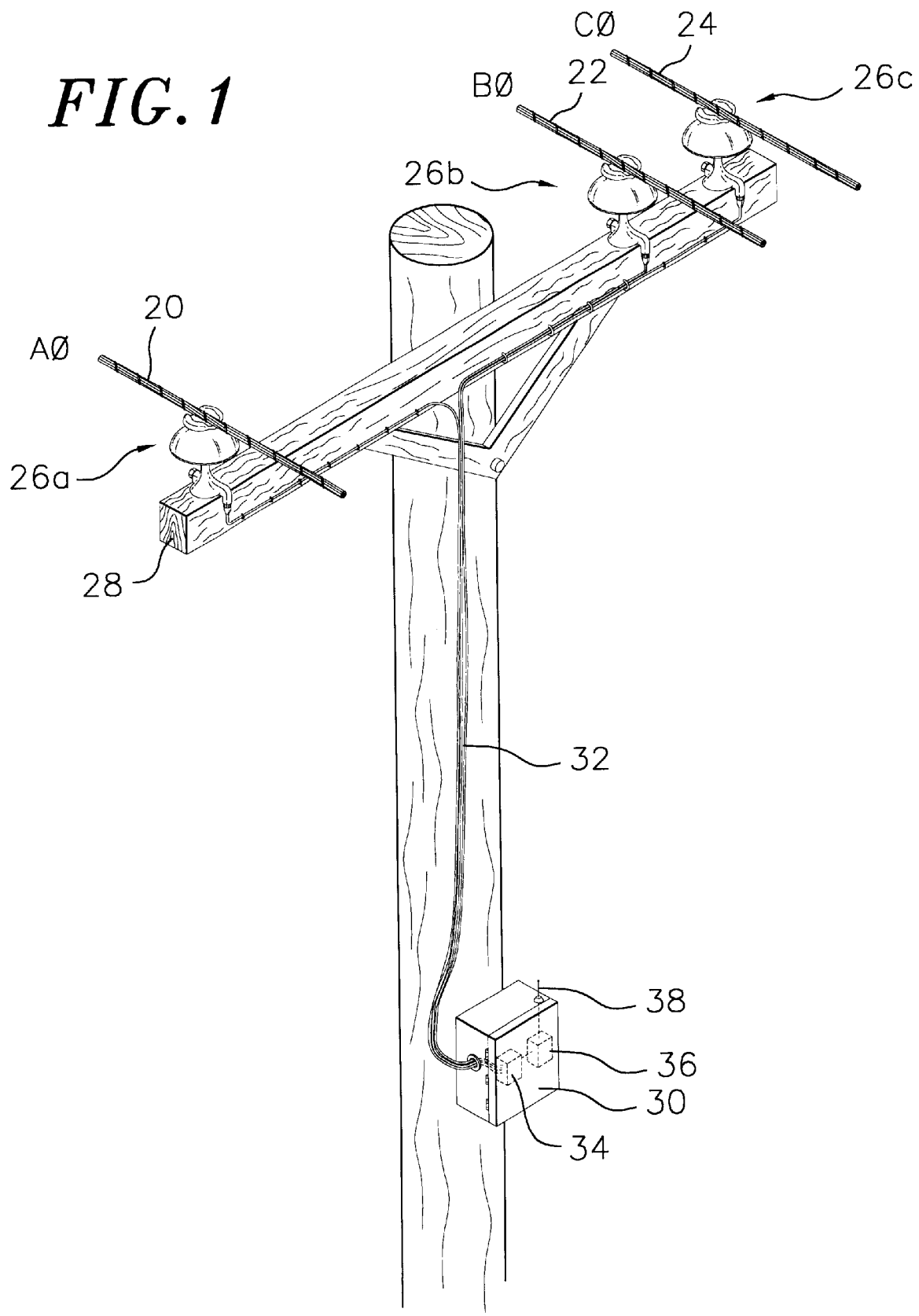
FIG. 1 is a system level diagram of a power distribution system, with three phase power lines supported with pin insulators that house sensors which forward information to a unit housing for processing and display.

In a preferred embodiment of the present invention, a sensing device is employed to interface with an overhead power line to assist in the performance of a variety of functions, such as, for example, tracking customer usage, monitoring system load and reliability as well supplying data for system control. Referring to FIG. 1, in the field of power transmission and distribution, generating systems produce electrical power which is transmitted through a grid of electrical high voltage alternating-current (AC), three-phase power lines (20, 22 and 24). Pin type insulators 26(a), 26(b) and 26(c) (hereinafter referred to as pin insulator), as described by ANSI C29.5 and C29.6 standards, are universally accepted as the standard insulator used for supporting and insulating the high voltage (4 to 69 kV) power lines 20, 22 and 24.

A preferred embodiment of the present invention integrates a sensor within the supporting pin insulator 26. The commercially available pin insulator 26 provides the insulation and protection for the sensing device (not shown) and the signal wires located under it. The entire assembly is fastened to a wood cross-arm or pole bracket 28.

The sensor measures at least one operating characteristic of the overhead power line and outputs that characteristic to a control unit housing 30 located at the base of the pole via an external cable 32. The characteristic may relate to any aspect of current or voltage on the line, or any other characteristic of the line. The control unit housing 30 preferably contains a control unit 34 that receives an output from the sensor and forwards the received power line characteristics to a remote terminal unit 36. The remote terminal unit 36 is preferably coupled to a radio (not shown) located inside the control unit housing 30 which is coupled to an antenna 38 located just outside the control unit housing 30 for sending, via RF radio signals, data output by the sensor concerning power line characteristics to a remote control station (not shown). In addition, the remote terminal unit 36 may receive control or reprogramming signals transmitted from the remote ground monitoring and control station (not shown). The control unit 34 may be used to calibrate the sensor, either remotely via commands sent from the control station or locally at the control unit 34.

Figure 2:
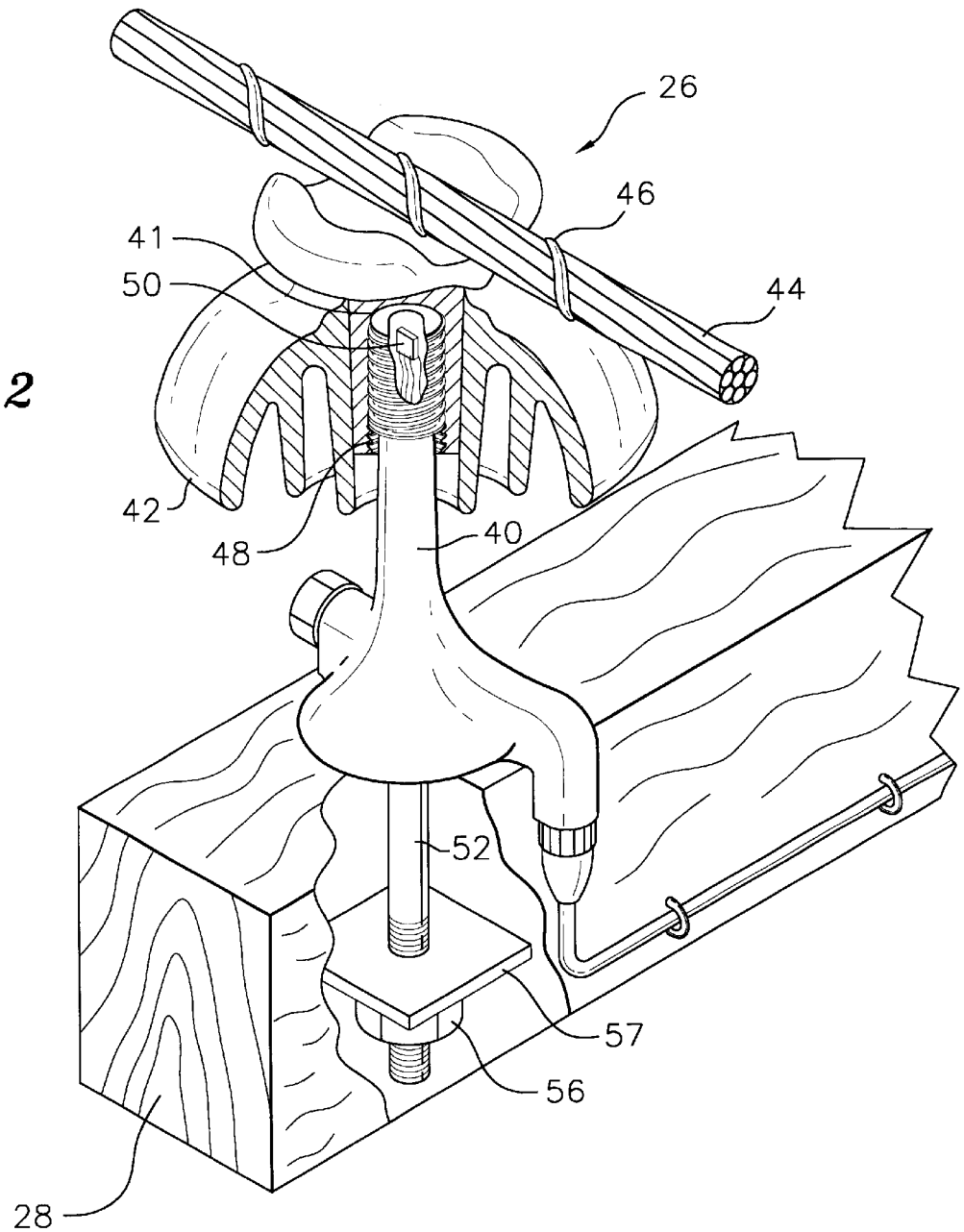
FIG. 2 is a perspective view of a preferred current sensor installed in the pin of pin type insulator that is used to support a power line.

Referring to FIG. 2, the pin insulator 26 assembly includes a standard pin 40 that supports an insulator 42 and fastens the pin insulator 26 to the wood cross-arm 28 or pole-mounting bracket. The pin 40 and insulator 42 preferably comply with the requirements set forth in various standards such as for example ANSI C29.5 and C29.6, the contents of which are incorporated herein by reference as if set forth in full. In the preferred embodiment, the top of the pin 41 is in the range of about ⅝" to 2" below energized conductor 44. The top of pin 41 is separated from the conductor 44 by the industry standard insulator 42, which is preferably screwed onto the pin 40. A tie wire 46 preferably secures the conductor 44 to the insulator 42. One of ordinary skill in the art will appreciate that the present invention may be adapted for use in any pin type insulator assembly, including those fabricated in accordance with various international standards, such as, for example, British standard B.S. 137-1960. Therefore, the preferred pin type insulator is by way of example and not limitation.

The insulator 42 is preferably commercial grade wet-process porcelain. The electric field around the interface of conductor 44 and insulator 42 is highly stressed, which can result in corona discharge. Therefore, the upper portion and pin hole threaded aperture 48 of the exemplary insulator 42 are preferably coated with a semiconductive glaze to minimize radio interference.

In accordance with the applicable standards, the preferred pin 40 should be either one inch or one and three-eight's inches in diameter. The threads of pin 40 preferably comply with ANSI C29.5 and C29.6 for either one inch or one and three-eights inch diameter threaded pin, preferably having four threads per inch for domestic applications in the United States. The body of the pin 40 is preferably made from an aluminum casting. The aluminum casting is preferably cored to allow electrical attachments internal to the pin 40. One of ordinary skill in the art will appreciate that the present invention may be adapted to accommodate various pin characteristics so that the preferred pin characteristics are by way of example and not limitation.

In the preferred embodiment, the top of the pin 41, that portion nearest the electrical conductor 44, is recessed to house a current sensor 50. The protected proximity of the top of the pin 40 to the high voltage conductor 44 immerses the current sensor 50 in the strong magnetic field generated by the current carrying high voltage conductor 44. Advantageously, the high voltage conductor 44 does not have to be cut for installation and the standard insulator 44 may be easily adapted, if necessary, for maintenance or upgrading to a higher voltage conductor 44.

Figure 3:
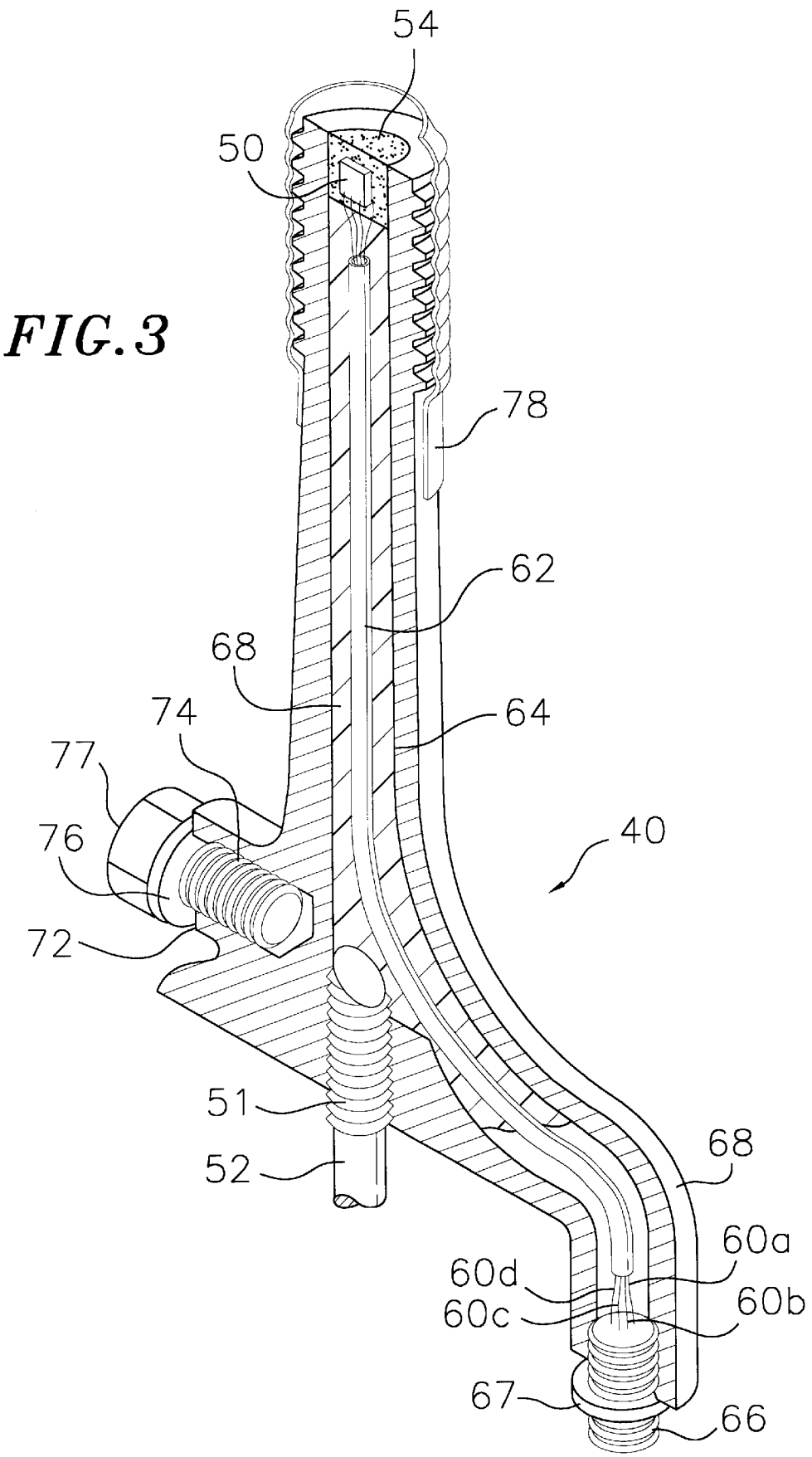
FIG. 3 is a perspective view, partly in cross section, of the preferred pin housing a current sensor with a water tight plug for electrically coupling the sensor to a control unit.

Referring to FIG. 3, the bottom of the pin 40 is preferably machined in a plurality of places. The exemplary pin 40 preferably includes a threaded aperture 51 directly below the head of the pin. A support rod 52 with threads on both sides is then screwed into the pin 40. The support rod 52 may then be inserted through the wood cross-arm 28 and attached thereto with a flat washer 54 a lock washer and a nut 56 (see FIG. 2). In the exemplary embodiment, the support rod 52 is preferably aligned with the head of pin 40 to optimize the transfer of loads from the pin insulator 26 to the cross-arm 28 (see FIG. 2). The support rod 52 is preferably galvanized steel and on the order of about five eights inches in diameter. In addition, the end of the support rod 52 threaded into pin 40 is preferably slant cut at an angle in the range of about 30–60 degrees. One of ordinary skill in the art will appreciate that the pin insulator 26 may be attached to the wood cross-arm 28 by a variety of techniques including, for example, clamps, rivets, tie wraps or any other suitable means. Therefore the exemplary support rod is by way of example and not by way of limitation.

In the exemplary embodiment, the current sensor 50 is preferably a programmable gain linear Hall effect sensor, such as for example, the MLX90215 manufactured by Microelectronic Integrated Systems, located in Webster, Mass. The core of the Hall effect sensor is a Hall effect element. When a magnetic field is in the near vicinity of the hall effect element, a current flows within this material that is proportional to the strength of the magnetic field.

A Hall effect sensor is basically a Hall effect element with a terminal wired to each end of the Hall effect element. The current produced in the Hall effect element creates a potential difference between the two terminals that is proportional to the strength of the magnetic field and indirectly the current flowing through the electrical conductor. The Hall effect sensor preferably includes a feedback loop that allows the sensor to be externally calibrated. External calibration adjusts the ratio of the voltage output and the strength of the external magnetic field created by the high voltage power line as a function of a secondary measurement. The preferred current sensor measures the current in the electrical conductor to an accuracy of approximately 1–10%. One of ordinary skill in the art will appreciate that alternate current sensors such as, for example, air core or lead core transformers with multiple conductive windings may be used in place of the preferred Hall effect sensor. Therefore, the Hall effect sensor is set forth by way of example only.

Figure 3A:
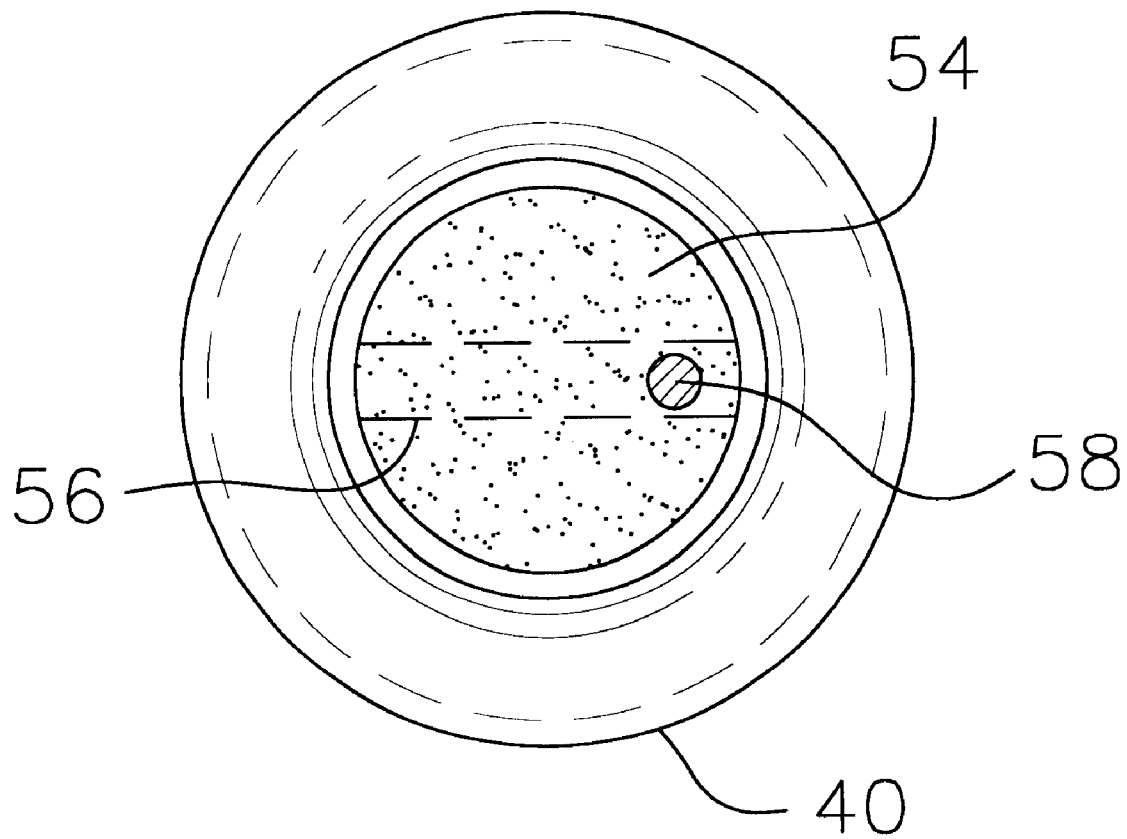
FIG. 3A is a top plan view of a circular housing for tapping and housing the current sensor in the top of the pin of the pin type insulator.

Referring to FIG. 3A, the current sensor 50 (hereinafter referred to as the Hall effect sensor) is located inside a round aluminum or epoxy enclosure 54 preferably with a slot 56 and an external punch mark 58 to reference the location of the slot 56. The Hall Effect sensor 50 is bonded into the slot 56 on the lower surface of the enclosure. The direction of the Hall effect sensor corresponds to the direction of current flow in the electrical conductor and is indicated by the punch mark 58 at the top of the round enclosure 54. Referring back to FIG. 3, in the exemplary embodiment the Hall effect sensor has four wires 60*a–d* which are connected to internal cabling 62 that is threaded through the cavity of the aluminum pin 40. The four wire electrical cable is then attached to a four-pin watertight connector 66. Connector 66 is preferably coupled to the control unit 34 located at the base of the pole via the external cable 32 (see FIG. 1).

A DC power supply, preferably 5 volt, for the current sensor is located in the control unit housing 30. Preferably the DC power supply is connected to a standard 120 VAC circuit, with back up battery power. In an alternate embodiment, the DC power supply may be completely battery powered. In the preferred embodiment the DC power supply is used to power a set of three current sensors, (i.e. one for each phase).

In addition, control unit 34 preferably includes a multi-purpose readout that may be used to calibrate the current signals and to display the readings. Each sensor may be calibrated independently. Coarse current calibration is preferably performed by measuring the distance (in inches) from the center of the conductor to the base of the insulator support pin and entering this information into the readout device. Fine calibration may be performed by measuring the current carried by the power line with an auxiliary meter, such as, for example, a hot stick current meter and entering this calibration data into the readout device. The calibrated output of the control unit 32 may then be transmitted to a remote control center via remote terminal unit 36. Alternatively, the power supply and readout device may provide analog output signals or alarm contacts which are forwarded to other data collection or communication equipment.

The preferred pin 40 includes an offset leg 68 that extends below the wood cross-arm to which the pin insulator 26 is attached. The offset leg is preferably installed to indicate the direction of current flow in the electrical conductor. The round enclosure 54 that engages the Hall effect sensor is preferably press fit into the top of the pin 40 with the direction of the Hall effect sensor (the punch mark 58) corresponding to the direction of the offset leg 68 of the pin 40. This gives an external indication of the direction of current flow being measured.

In the preferred embodiment, the cavity 64 of pin 40 is filled with epoxy 70 to within approximately one-two inches of the top of the four-pin water tight connector 66. The epoxy internally seals the Hall effect sensor and substantially prevents any moisture intrusion. In addition, the epoxy substantially secures the support rod 52 in place due to the slanted cut on the end of the pin that was threaded into the pin 40. After the epoxy dries, the four pin water tight connector 66 is screwed onto the pin along with appropriate sealing measures such as an o-ring 67 to prevent moisture intrusion at the lower end.

In the preferred embodiment, pin 40 further comprises a machined surface 72 and a threaded aperture 74 which engage a ground clamp connection 76. The ground clamp 76 is preferably secured to and grounds the machined surface via a bolt 77 that is screwed into threaded aperture 74. The pin 40 preferably has a semi-conductive heat shrink 78 or memory retention sleeve applied to the top of the aluminum threads to allow proper sealing/seating of the porcelain pin type insulator.

Figure 4:
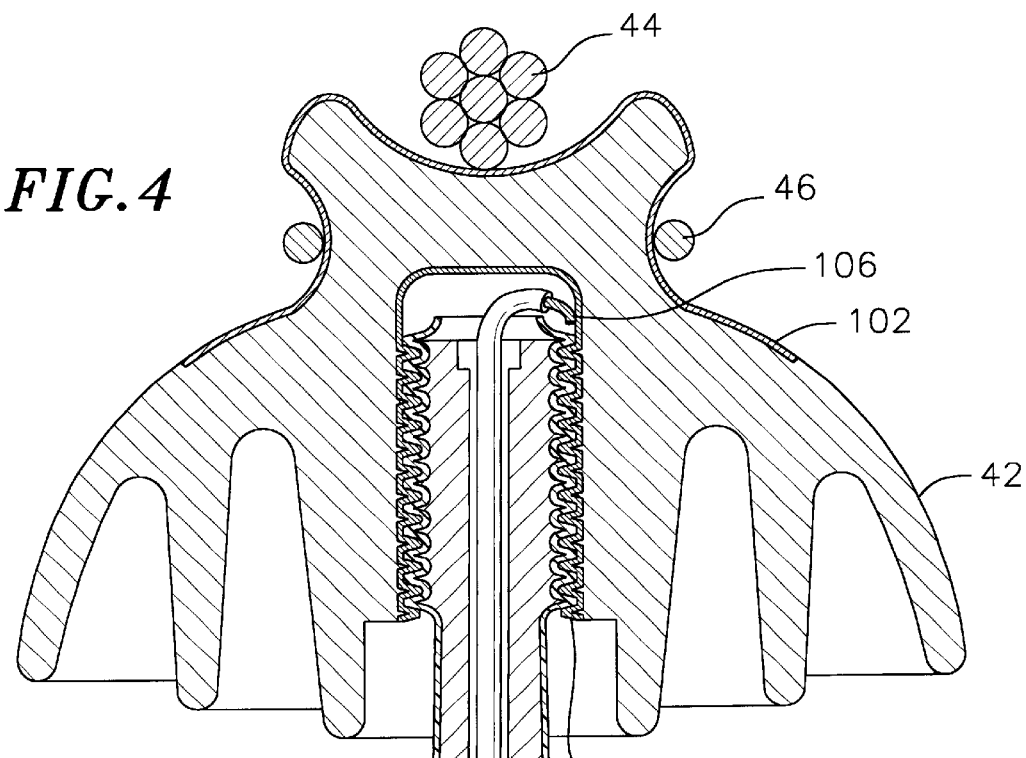
FIG. 4 is a cross-sectional view of a pin type insulator that includes a capacitor formed by a semiconductive glaze applied to the upper surface and threaded aperture of the insulator, which is coupled to the electrical conductor of a voltage sensor for measuring the voltage on the power line.

Referring to FIG. 4, in another aspect, the present invention comprises a voltage sensor that detects the presence of a voltage on the high voltage electrical conductor 44 as well as estimates the phase of the voltage. The periodic detection of a voltage on an electrical conductor is useful when performing fault isolation on the electrical conductor.

In one aspect, the semiconductive glaze applied to the upper surface 102 and threaded aperture 104 of the insulator 42 is separated by the dielectric porcelain that forms the body of insulator 42. The semiconductive glaze coated surfaces 102 and 104 form a capacitor (C1) with electrical conductor 44 acting as an input voltage applied to C1. In the preferred alternate embodiment an electrical conductor 106, preferably stainless steel bonding wire is electrically coupled with the semiconductive glaze applied to the threaded aperture 104. In the alternate embodiment, insulator 108 isolates pin 40 from the semiconductive glaze applied to the threaded aperture 104. Insulator 108 is preferably an insulating heat shrink wrap.

Figure 4A:
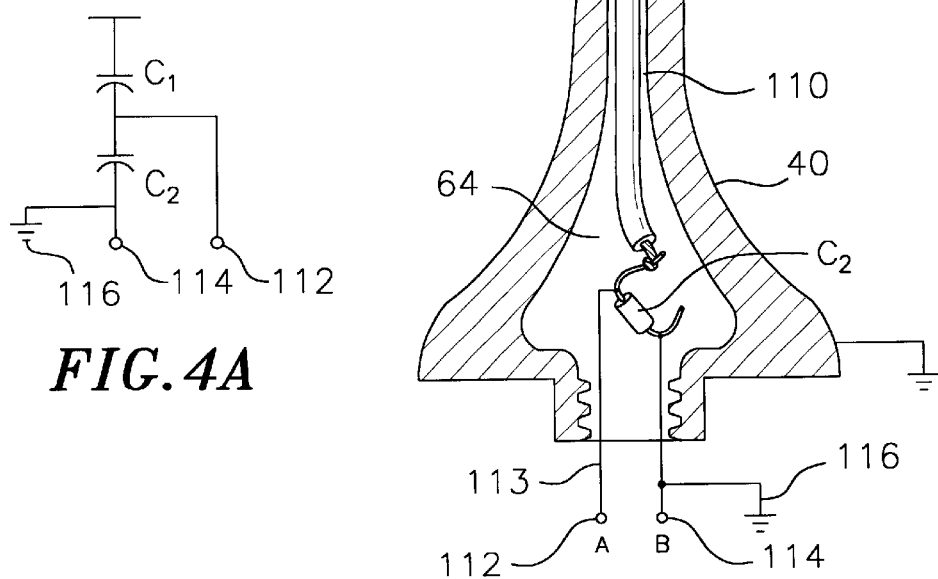
FIG. 4A is a schematic diagram of a voltage divider circuit implementation of the voltage sensor of FIG. 4.

In the alternate embodiment, electrical conductor 106 is preferably coupled to a cable 110 having two outputs 112 and 114. A grounded shunt 116 is connected between the electrical conductor 106 and the output 114. Cable 110 is preferably installed in cavity 64 of pin 40. A second capacitor C2 111 is preferably connected between electrical conductor 106 and the grounded shunt 116. The second output 112 is a wire 113 connected in shunt between capacitor 111 and the electrical conductor to provide the voltage divider circuit shown in FIG. 4A. In operation the high voltage electrical conductor 44 provides the input voltage to C1. The differential output voltage $V_{AB}$ is preferably in the range of about 1–10 volts and is determined by the product of the input voltage $V_{In}$ and the ratio C2/C1.

For an exemplary 15 kilo volt pin isolator, an input voltage $V_{In}$ will be on the order of about 10 kV. C1 is typically in the range of 20 picofarad and C2 is preferably on the order of about 50 nanofarad, to provide a ratio of approximately 1:2500 and an output voltage of approximately 4 volts. The exact value of the output voltage need not be constant with time. In fact, the capacitance C1 of the isolator 42 will vary with time depending upon such factors as erosion of the semiconductive glaze, contamination, precipitation or other factors. However, the system monitoring and fault isolation functions may be satisfied by accurate detection of the presence of a voltage on the electrical conductor, i.e. a voltage on voltage off detection. Because accurate measurement of actual voltage level is not required, the preferred system need not be time invariant and variation in the value of capacitor C1 does not diminish system performance. One of ordinary skill in the art will appreciate that C2 may be a variable capacitor that may be externally calibrated to provide a voltage in the preferred range so that the described exemplary capacitive values are by way of example and not limitation.

Outputs 112 and 114 are preferably routed to a watertight connector (not shown) and coupled to the control unit 32 (see FIG. 1) via the external cable 32. The control unit 32 preferably measures and displays the differential voltage across terminals 112 and 114. The control unit 34 forwards the measured voltage to the remote terminal unit 36 for transmission to a remote control center. In the preferred embodiment, capacitor C2 is variable and under direction of control unit 32, which may calibrate the voltage sensor by adjusting the output voltage across terminals 112 and 114 to correspond with the approximate known voltage at the sensor location.

In the preferred voltage sensor embodiment, support rod 52 again couples pin 40 to the wood cross-arm of the power line pole. In addition, pin 40 is preferably grounded with the ground clamp as previously described for the current sensor embodiment.

Figure 5:
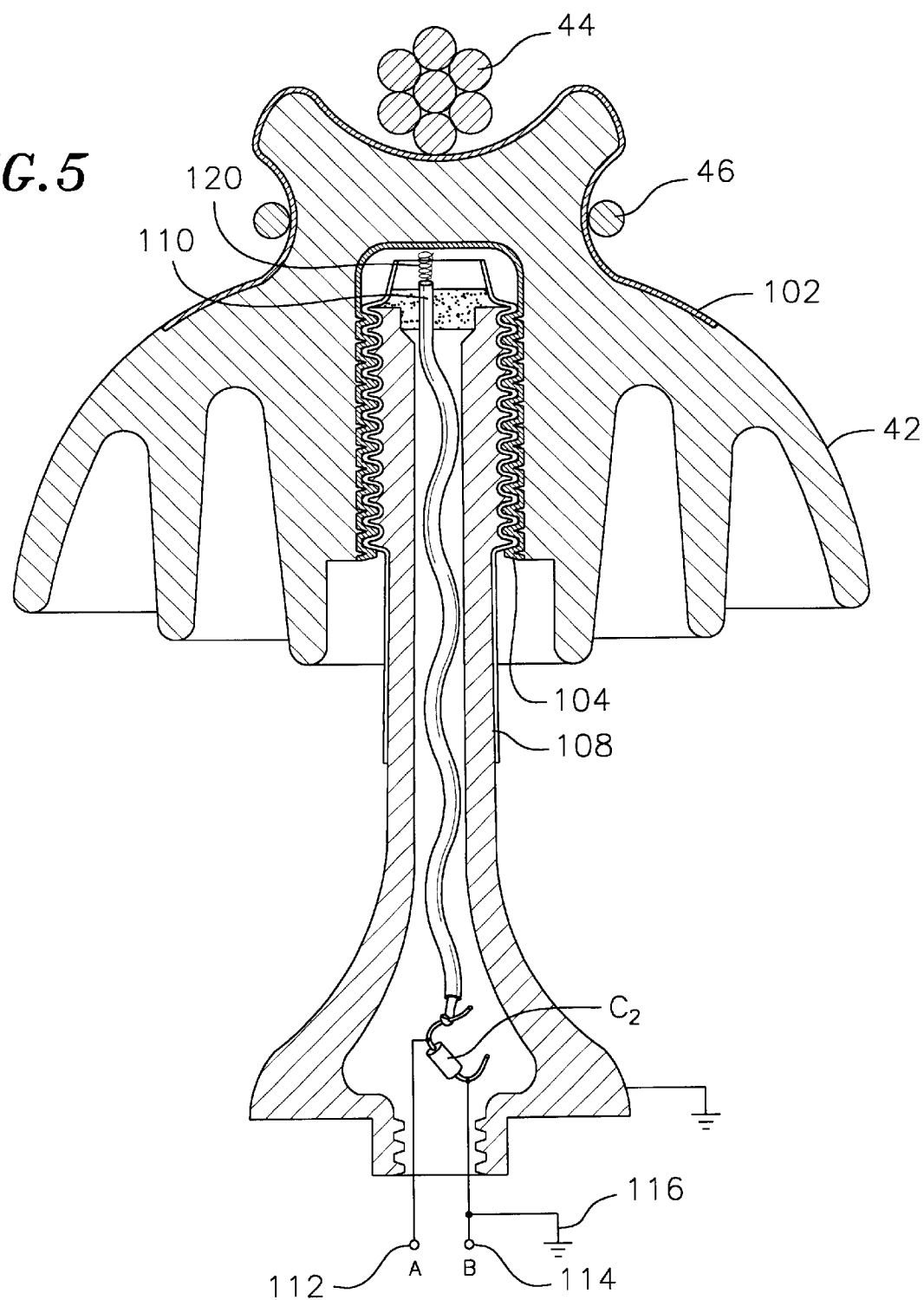
FIG. 5 is a cross-sectional view of a combined voltage/current sensor integrated into the pin of a pin type insulator.

The described exemplary voltage sensor may utilize a variety of techniques to electrically couple to the semiconductive glaze applied to the threaded aperture 104. For example, referring to FIG. 5, a conductive spring 120 may be used to couple the cable 110 with the semiconductive glaze applied to the threaded aperture 104. When installed the conductive spring 120 is compressed by the semiconductive glazed threaded aperture to ensure adequate electrical conductivity.

Figure 6:
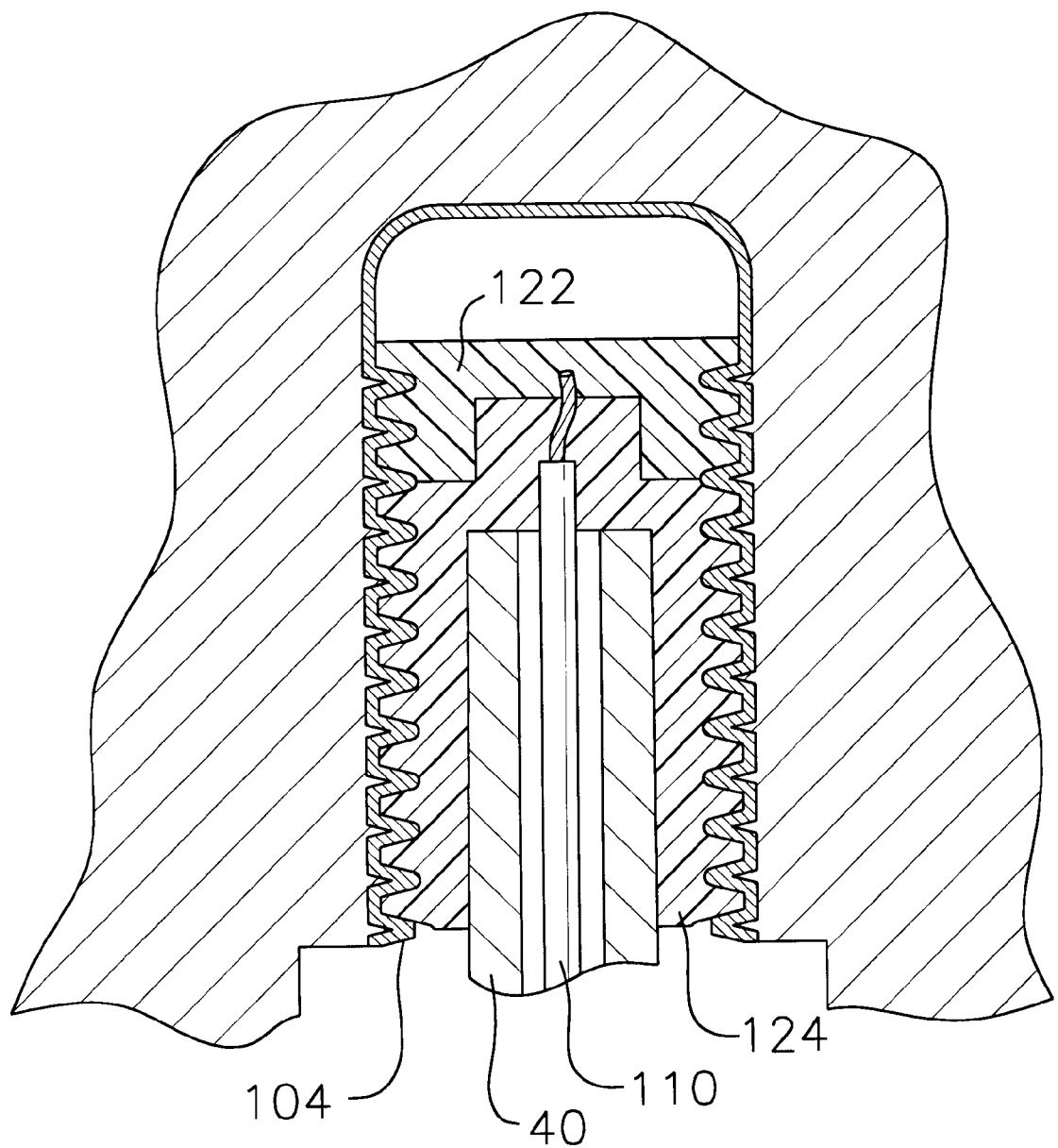
FIG. 6 is a cross-sectional view of an alternate voltage sensor combined with a current sensor integrated into the pin of a pin type insulator.

Alternatively, conductive pin 40 may be terminated with molded conductive neoprene 122 (i.e. neoprene loaded with carbon black)(see FIG. 6), or other similar materials. Cable 110 may then be embedded into the conductive neoprene 122 to provide electrical conductivity with the semiconductive glaze applied to the threaded aperture 104 of the isolator. In addition, an insulator 124 should preferably be applied to pin 40 below the conductive neoprene to ensure that the pin 40 is properly isolated from the semiconductive glaze applied to the threaded aperture 104 of the isolator.

Figure 7:
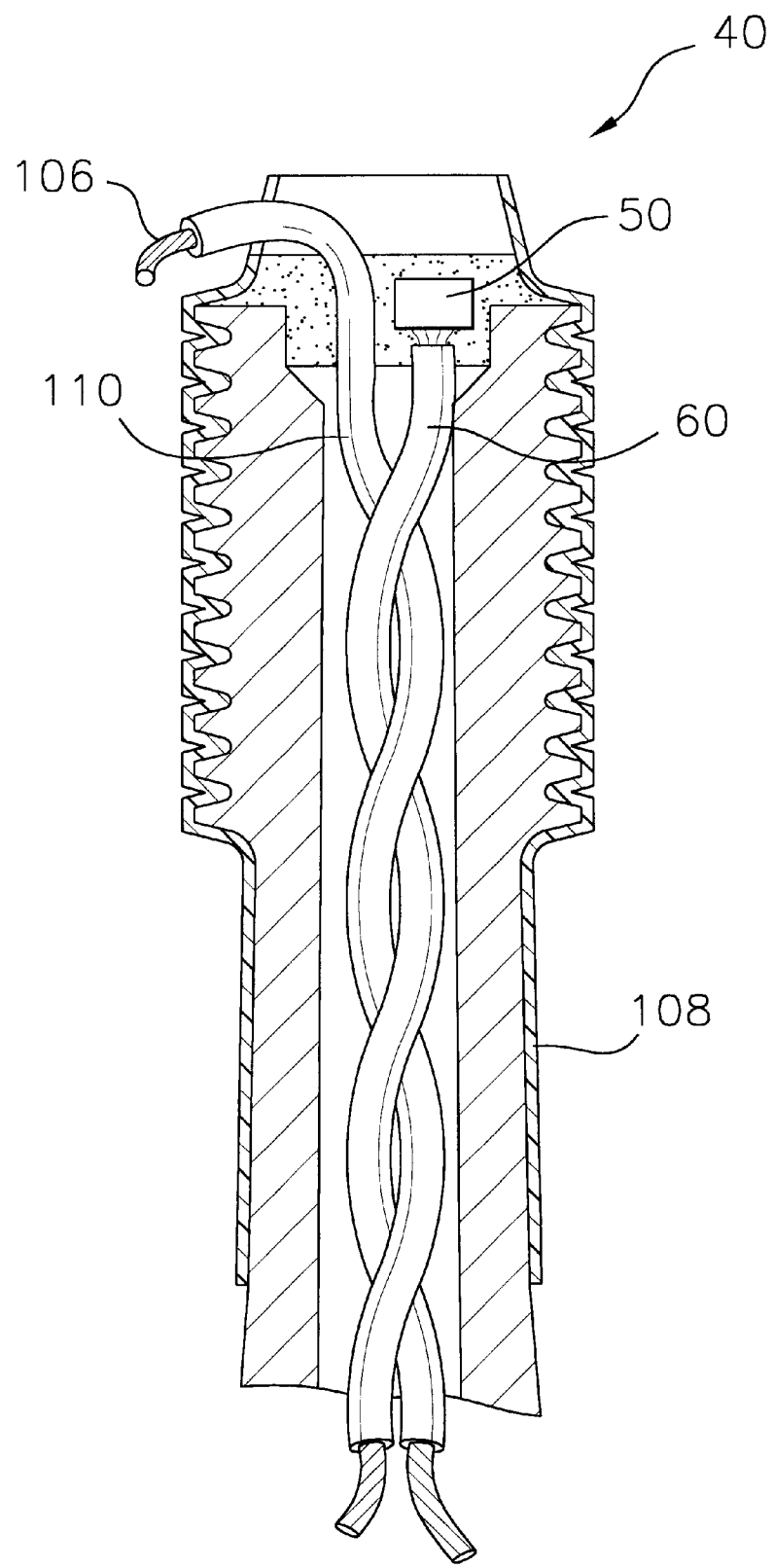
FIG. 7 is a cross-sectional of a further alternate voltage sensor combined with a current sensor integrated into the pin of a pin type insulator.

In another aspect of the present invention, the current sensor and voltage sensor may be combined in a single embodiment. Referring to FIG. 7, the stainless electrical conductor 106 is preferably used to terminate cable 110 so as to provide electrical continuity with the semiconductive glaze applied to the threaded aperture (see FIG. 4). As with the preferred voltage sensor embodiment disclosed in FIG. 4, the electrical conductor would again be combined with a capacitor (not shown) to provide a voltage divider circuit for detecting the presence of a voltage on the high voltage electrical power line.

In addition, current sensor 50 may be bonded into the upper tip of pin 40 preferably with epoxy. A watertight connector (not shown) would again be used to couple the output of the voltage and current sensors to the control unit via the external cable. The conductive pin 40 is again treated with an insulator 108 to isolate the pin 40 from the semiconductive glaze applied to the threaded aperture. Insulator 108 is preferably an insulating heat shrink wrap. In the alternate embodiment, the phase of the current as estimated by the current sensor and the phase of the voltage on the electrical conductor 106 may be used to estimate a power factor to estimate the optimal capacitive load to balance the high voltage power line.

Although a preferred embodiment of the present invention has been described, it should not be construed to limit the scope of the appended claims. Those skilled in the art will understand that various modifications may be made to the described embodiment. For example, the exemplary current sensor may be integrated with a variety of pin type insulators as required to support various electrical conductor voltages and loads. In addition, the voltage sensor may be realized by any of a variety of techniques which provide electrical conductivity to the semiconductive glaze applied to the threaded aperture of the isolator. Moreover, to those skilled in the various arts, the invention itself herein will suggest solutions to other tasks and adaptations for other applications. It is therefore desired that the present embodiments be considered in all respects as illustrative and not restrictive, reference being made to the appended claims rather than the foregoing description to indicate the scope of the invention.

What is claimed is:

1. A system for measuring characteristics of a power line supported by a power line pole comprising:
   a pin having a first end coupled to the pole and a second, threaded end, adapted to engage a sensor, wherein said sensor measures at least one characteristic of the power line; and
   an insulator having a threaded aperture coupled to the second thread end of said pin, wherein said power line is supported by said insulator and said pin.

2. The system of claim 1 wherein said sensor comprises a current sensor that measures the current on said power line.

3. The system of claim 2 wherein said current sensor is a Hall effect sensor.

4. The system of claim 1 wherein said insulator comprises commercial grade porcelain, glass, polymer or epoxy.

5. The system of claim 1 wherein said pin is adapted to indicate the direction of current flow on the power line.

6. The system of claim 1 further comprising a control unit which displays the output of said sensor.

7. The system of claim 6 wherein said control unit calibrates the sensor.

8. The system of claim 6 further comprising a remote terminal unit in communication with said control unit, wherein said remote terminal unit communicates the measured power line characteristic to a remote control center.

9. The system of claim 1 wherein said insulator further comprises:
   support surface adapted to support said power line.

10. The system of claim 9 wherein said insulator support surface and aperture are treated with a semiconductive material and wherein said treated support surface and aperture form a capacitor.

11. The system of claim 10 wherein said sensor comprises a voltage sensor coupled to said treated aperture, wherein output of said voltage sensor is proportional to voltage on said power line.

12. The sensor of claim 11 wherein said voltage sensor comprises a voltage divider.

13. The system of claim 11 wherein said voltage sensor comprises:
   an electrical conductor coupled to said treated aperture;
   a capacitor electrically coupled between said electrical conductor and a first output; and
   a second output electrically coupled to said electrical conductor, wherein the output voltage across said first and second outputs is proportional to the voltage on said power line.

14. The system of claim 11 whereon said voltage sensor comprises;
   a conductive molding coupled to said treated aperture;
   a capacitor electrically coupled between said conductive molding and a first output; and
   a second output electrically coupled to said conductive molding, wherein the output voltage across said first and second outputs is proportional to the voltage on said power line.

15. The system of claim 10 wherein said sensor comprises a current sensor housed in the second end of said pin and a voltage sensor coupled to the treated aperture.

16. The system of claim 15 wherein said current sensor is a Hall effect sensor.

17. The sensor of claim 15 wherein said voltage sensor comprises a voltage divider.

18. The system of claim 15 wherein said voltage sensor comprises:
an electrical conductor coupled to said treated aperture;
a capacitor electrically coupled between said electrical conductor and a first output; and
a second output electrically coupled to said electrical conductor, wherein the output voltage across said first and second outputs is proportional to the voltage on said power line.

19. The system of claim 15 wherein said voltage sensor comprises:
a conductive molding coupled to said treated aperture;
a capacitor electrically coupled between sand conductive molding and a first output; and
a second output electrically coupled to said conductive molding, wherein the output voltage across said first and second outputs is proportional to the voltage on said power line.

20. A method of measuring at least one characteristic of a power line supported by a power line pole, comprising:
engaging a sensor with a first, threaded end of a pin;
coupling an insulator, having a threaded aperture to the first end of said pin;
coupling a second end of the pin to said pole;
coupling the power line to said insulator such that said power line is supported by said insulator, pin and pole; and
measuring a characteristic of said power line.

21. The method of claim 20 further comprising:
measuring a characteristic of said power line with a secondary measurement device; and
calibrating said sensor as a function of said secondary measurement.

22. The method of claim 20 further comprising communicating the measured characteristic to a remote control center.

23. The method of claim 20 wherein the insulator further comprises:
a support surface adapted to support said power line and an aperture adapted to engage said pin, wherein said support surface and aperture are treated with a semiconductive material; and
wherein the step of coupling said pin to said insulator further comprises coupling said sensor to said treated aperture.

24. The method of claim 23 wherein the step of measuring a characteristic of said power line comprises outputting a voltage that is proportional to the voltage on said power line.

25. A system for measuring characteristics of a power line supported by a power line pole comprising:
a pin having a first end coupled to the pole and a second threaded end adapted to engage a voltage sensor that measures voltage on said power line; and
an insulator coupled to the second threaded end of said pin, wherein said power line is supported by said insulator and said pin.

26. The sensor of claim 25 wherein said voltage sensor comprises a voltage divider.

27. The system of claim 25 further comprising a current sensor housed in the second end of said pin.

28. The system of claim 27 wherein said current sensor is a Hall effect sensor.

29. The system of claim 25 wherein said insulator further comprises:
a support surface adapted to support said power line; and
an aperture adapted to engage said pin.

30. The system of claim 29 wherein said insulator support surface and aperture are treated with a semiconductive material and wherein said treated support surface and aperture form a capacitor.

31. The system of claim 30 wherein said voltage sensor comprises:
an electrical conductor coupled to said treated aperture;
a capacitor electrically coupled between said electrical conductor and a first output; and
a second output electrically coupled to said electrical conductor, wherein the output voltage across said first and second outputs is proportional to the voltage on said power line.

32. The system of claim 30 wherein said voltage sensor comprises:
a conductive molding coupled to said treated aperture;
a capacitor electrically coupled between said conductive molding and a first output; and
a second output electrically coupled to said conductive molding, wherein the output voltage across said first and second outputs is proportional to the voltage on said power line.

* * * * *

UNITED STATES PATENT AND TRADEMARK OFFICE
CERTIFICATE OF CORRECTION

PATENT NO. : 6,555,999 B1
DATED : April 29, 2003
INVENTOR(S) : Keith E. Lindsey et al.

It is certified that error appears in the above-identified patent and that said Letters Patent is hereby corrected as shown below:

Title page,
Item [56], References Cited, U.S. PATENT DOCUMENTS, delete
"5,250,894 A    *    10/1993    Bridgese et al. …….324/127" insert
-- 5,250,894 A  *    10/1993    Bridges et al. …….324/117 H -- insert
-- 4,823,022 A  *    04/1989    Lindsey………..174/139 --
FOREIGN PATENT DOCUMENTS, delete "JP    2059678" insert -- JP    02059678 --
delete "JP    2139811" insert -- JP    02139811 --

Column 8,
Line 11, delete "thread end", insert -- threaded end --
Line 30, insert -- a -- before "support surface"
Lines 50-51, delete "whereon said voltage sensor comprises;", insert -- wherein said voltage sensor comprises: --

Column 9,
Line 13, delete "between sand", insert -- between said --

Signed and Sealed this

Eleventh Day of January, 2005

JON W. DUDAS
*Director of the United States Patent and Trademark Office*